United States Patent [19]

Sievers et al.

[11] Patent Number: 5,089,466
[45] Date of Patent: Feb. 18, 1992

[54] STABLE MIXED METAL SUPERCONDUCTIVE OXIDES CONTAINING NITROGEN

[75] Inventors: Robert E. Sievers; Stephen A. Montzka, both of Boulder, Colo.

[73] Assignee: The University of Colorado Foundation, Inc., Boulder, Colo.

[21] Appl. No.: 216,643

[22] Filed: Jul. 8, 1988

Related U.S. Application Data

[63] Continuation-in-part of Ser. No. 134,251, Dec. 17, 1987.

[51] Int. Cl.$^5$ .............. C01F 11/02; C01F 17/00; C01G 3/02; H01L 39/02
[52] U.S. Cl. .................. 505/1; 252/521; 423/604; 423/635; 501/123; 501/152; 505/780
[58] Field of Search ............ 502/525; 505/1, 780; 252/521; 501/123, 152; 423/604, 635

[56] References Cited

U.S. PATENT DOCUMENTS

| | | | |
|---|---|---|---|
| 4,748,016 | 5/1988 | Browaeys et al. | 501/137 |
| 4,784,686 | 11/1988 | Meek et al. | 252/521 |
| 4,804,649 | 2/1989 | Sherif | 252/521 |
| 4,824,826 | 4/1989 | Damento et al. | 252/521 |
| 4,859,652 | 8/1989 | Block | 252/518 |
| 4,861,753 | 8/1989 | McCarron, III | 501/123 |
| 4,866,031 | 9/1989 | Bolt et al. | 505/1 |
| 4,898,851 | 2/1990 | Michel | 501/123 |
| 4,943,558 | 7/1990 | Soltis et al. | 505/1 |

OTHER PUBLICATIONS

Matthews et al., "Increased Transition Temperatures in YBa$_2$Cu$_3$O$_y$...", *Nature*, vol. 328, Aug. 27, 1987, pp. 786–787.
Kistenmacher, "Structural Basis for Enhanced Tc in YBa$_2$Cu$_3$O$_y$F$_x$", *Physical Review B*, vol. 36(13), Nov. 1, 1987, pp. 7197–7198.
Ovshinsky, "Superconductivity at 155 K", *Phys. Rev. Lett.*, vol. 58(24), Jun. 15, 1987, pp. 2579–2581.
Mizuno, "Reaction of the Monoxider of...", *J. Chem. Soc., Chem. Commnn.*, Jul. 1, 1988, p. 887.
Wu et al., *Physical Review Letters*, vol. 58, No. 9, pp. 908–910 (1987).
Hor et al., *Physical Review Letters*, vol. 58, No. 9, pp. 911–912 (1987).
Moodenbaugh et al., *Physical Review Letters*, vol. 58, No. 18, pp. 1885–1887 (1987).
Murphy et al., *Physical Review Letters*, vol. 58, No. 18, pp. 1889–1890 (1987).
Hor et al., *Physical Review Letters*, vol. 58, No. 18, pp. 1891–1894 (1987).
Er-Rakho et al., *Journal of Solid State Chemistry*, vol. 37, pp. 151–156 (1981).
Hakuraku et al., *Appl. Phys. Lett.*, vol. 52, No. 18, May 1988, pp. 528–530.
Dagani, *Chemical and Engineering News*, May 16, 1988, pp. 24–29.
Chemical Abstract No. 104:229149U, Chemical Abstract No. 106:77252Y.
Berry et al., *Appl. Phys. Lett.*, vol. 52, No. 20, May 16, 1988, pp. 743–745.
Berry et al., Applied Physics Letters, vol. 52, No. 20, May 1988, pp. 1743–1745.
Dagani, Chemical and Engineering News, May 1988, pp. 24–29.
Berry et al., MRS Conference Proceedings, Apr. 5–9, 1988, pp. 141–143.
Osofsaky et al., MRS Conference Proceedings, Apr. 23–24, 1987, pp. 173–175.
Kapitulnik et al., Proceedings of the Adriatico Research Conference on High Temperature Superconductors, Jul. 5–8, 1987, pp. 131–149.
Hakuraku et al., Applied Physics Letters, vol. 52, No. 18, May 1988, pp. 1528–1530.

*Primary Examiner*—Paul Lieberman
*Assistant Examiner*—John Boyd
*Attorney, Agent, or Firm*—Lowe, Price, Leblanc & Becker

[57] ABSTRACT

Stable mixed metal oxide compositions containing nitrogen are formed by treating an oxygen-deficient perovskite composition with nitrogen dioxide. Preferably, the oxygen-deficient perovskite is of the formula $X_aZ_b$Cu$_c$O$_h$ wherein X is a member selected from the group consisting of yttrium, scandium, lanthanum, neodymium, samarium, europium, gadolinium, terbium, dysprosium, holmium, erbium, thulium, ytterbium, lutetium, bismuth and thallium, Z is a member selected from the group consisting of barium, strontium, calcium, magnesium and mixtures thereof, a is not less than 1, b is from 0 to 3, c is from 0 to 3, and h is not greater than about 6, and the mixed metal oxides are of the formula $X_aZ_b$Cu$_c$N$_j$O$_k$ where X, Z, a, b and c are as previously defined, j is from about 0.001 to about 3, and k is from about 6 to about 13.

10 Claims, No Drawings

STABLE MIXED METAL SUPERCONDUCTIVE OXIDES CONTAINING NITROGEN

RELATED APPLICATION

The present application is a continuation-in-part application of the copending Sievers application Ser. No. 134,251 filed Dec. 17, 1987.

FIELD OF THE INVENTION

The present invention relates to stable mixed metal oxide compositions containing nitrogen. The compositions are formed by treating oxygen-deficient perovskite compositions with nitrogen dioxide and exhibit superconductivity at relatively high temperatures.

BACKGROUND OF THE INVENTION

Recently, superconductive compositions including mixed oxides of rare earth, alkaline earth and copper metals have been discovered. For example, Wu et al., *Physical Review Letters*, Vol. 58, No. 9, pages 908–910 (1987) and Hor et al., *Physical Review Letters*, Vol. 58, No. 9, pages 911–912 (1987), disclose Y-Ba-Cu-O compound systems exhibiting superconductivity. Additionally, in *Physical Review Letters*, Vol. 58, No. 18 (1987), Moodenbaugh et al. (pages 1885–1887), Murphy et al. (pages 1889–1890) and Hor et al. (pages 1891–1894) disclose additional rare earth, alkaline earth, copper metal mixed oxide compositions exhibiting superconductive properties. Additional rare earth, alkaline earth, copper mixed metal oxides are disclosed by Er-Rakho et al., *Journal of Solid State Chemistry*, Vol. 37, pages 151–156 (1981). Generally, these references disclose the formation of the rare earth, alkaline earth, copper mixed metal oxide compositions by sintering the individual oxide powders. Hakuraku et al, *Appl. Phys. Lett.*, Vol. 52, No. 18, May 1988, pages 528–530, disclose superconducting Y-Ba-Cu-O compounds further including fluorine. Hakaraku et al disclose that the fluorine strengthens the superconductive connections among the grains of the material.

Additionally, rare earth-free thallium or bismuth containing materials have also been discovered which exhibit superconductive properties. Examples of these materials comprise Tl-Ba-Cu-O compounds such as $Tl_2Ba_2CuO_6$ and Tl-Ca-Ba-Cu-O compounds such as $Tl_2CaBa_2Cu_2O_8$ and $Tl_2Ca_2Ba_2Cu_3O_{10}$. Recent efforts in this area are summarized by Dagani, *Chemical and Engineering News*, May 16, 1988, pages 24–29.

Continual investigations are being made to discover additional superconductive compositions, superconductive compositions which exhibit superconductivity at higher temperatures and superconductive compositions which are stabilized against attack and degradation by moisture and by carbon dioxide.

SUMMARY OF THE INVENTION

Accordingly, it is an object of the present invention to provide new mixed metal oxide compositions which exhibit superconductivity. It is a further object of the invention to provide mixed metal oxide superconductive compositions which are prepared under relatively mild conditions as compared with previous known processes for preparing superconductive compositions. It is an additional object of the invention to provide superconducting materials which exhibit high critical temperatures.

These and additional objects are provided by the compositions of the present invention. The compositions of the present invention comprise stable mixed metal oxide materials containing nitrogen. It is believed that the mixed metal oxide compositions of the present invention contain stable nitrogen dioxide and/or nitrate moieties in their structure. The compositions are formed by treating oxygen-deficient perovskite compositions with nitrogen dioxide. The nitrogen dioxide treatment may be conducted at relatively low temperatures, for example, from about 20° C. to about 500° C.

Preferably, the stable mixed metal oxide compositions of the invention are of the formula $X_aZ_bCu_cN_jO_k$ wherein X is a member selected from the group consisting of yttrium, scandium, lanthanum, neodymium, samarium, europium, gadolinium, terbium, dysprosium, holmium, erbium, thulium, ytterbium, lutetium, bismuth and thallium, Z is a member selected from the group consisting of barium, strontium, calcium, magnesium and mixtures thereof, a is not less than 1, b is from 0 to 3, c is from 0 to 3, j is from about 0.001 to about 3 and k is from about 6 to about 13. The preferred compositions according to the present invention are of the formula $XBa_2Cu_3N_jO_k$ where X, j and k are as previously defined. The compositions according to the invention exhibit superconductivity at high critical temperatures and are easily prepared.

These and additional objects and advantages according to the present invention will be more fully understood in view of the following detailed description.

DETAILED DESCRIPTION

The mixed metal oxide compositions according to the present invention are prepared by treating oxygen-deficient perovskite mixed metal oxide compositions with nitrogen dioxide. The nitrogen dioxide is allowed to react with the oxygen-deficient perovskite mixed metal oxides at relatively mild conditions, namely at temperatures between ambient, for example, about 20° C., up to about 500° C. The compositions according to the invention have a higher oxygen content than known superconducting materials.

While not intending to be bound by the following, it is believed that the compositions of the invention contain nitrogen dioxide and/or nitrate moieties. The nitrogen dioxide moieties may be bonded to one or more of the metal ions and/or oxygen atoms. It is believed that the $NO_2$ moieties bridge grain boundaries. Chemical bonds between the nitrogen dioxide and the oxygen-deficient perovskite materials are formed since the annealing treatment is conducted at relatively low temperatures, particularly as compared with the temperatures required for conventional production of superconductive mixed metal oxide materials by sintering at 850° to 950° C. Nitrogen dioxide is a good oxidizing agent and it rapidly destroys and removes carbon and organic matter in the oxygen-deficient perovskite materials, particularly at grain boundaries. Impurities and poor contacts in grain boundaries generally increase electrical resistivity of superconducting materials and restrict practical use. It is believed that improvements in the grain boundary area are provided by the nitrogen component and therefore that the nitrogen component improves the superconducting properties of the resulting materials.

Conventional techniques for inserting oxygen in oxygen-deficient perovskites to make superconductors requires high temperature annealing treatment at approximately 400° to 1,000° C. At these temperatures, there is a tendency for ions to interdiffuse between the superconductive film and a substrate on which it is being formed, which interdiffusion adversely affects the film and/or the substrate. Since the mixed metal oxide compositions containing nitrogen according to the present invention are formed at relatively low temperatures, interdiffusion of ions between the compositions and a substrate on which the composition is coated is avoided. This both improves the mixed metal oxide films which are formed and allows the use of additional substrate materials which cannot withstand the high temperatures previously used to form superconducting materials.

Analysis of the nitrogen containing mixed metal oxide compositions of the present invention indicate that these compositions include a higher level of oxygen as compared with known superconducting materials, for example, as compared with the most exhaustively oxygen-annealed samples of $YBa_2Cu_3O_7$. It is known that high oxygen contents produce materials having higher critical temperatures. It is believed that the mixed metal oxide compositions containing nitrogen and additional oxygen according to the present invention therefore tend to exhibit higher critical temperatures than superconducting compositions prepared by conventional oxygen treatments.

Additionally, the presence of nitrogen in the mixed metal oxide compositions of the present invention stabilizes the compositions against attack and degradation of properties by moisture and by carbon dioxide. One of the major problems inhibiting practical widespread use of known superconducting compositions such as $YBa_2Cu_3O_7$ and related metal oxide formulations as superconductors is their long-term instability to attack by water and/or carbon dioxide in air. When the nitrogen containing materials of the present invention are contacted with water at room temperature, oxides of nitrogen are evolved and the orthorhombic material, $YBa_2Cu_3O_7$, is formed rather than the tetragonal oxygen-deficient $YBa_2Cu_3O_6$ perovskite materials from which the present materials are preferably synthesized. This indicates that the nitrogen stabilizes the superconductor against attack and degradation of properties by water. Additionally, because nitrogen dioxide is acidic, its incorporation is believed to retard attack by acidic carbon dioxide as well.

The mixed metal oxide compositions according to the present invention are preferably formed from oxygen-deficient perovskite materials of the formula $X_aZ_bCu_cO_h$ wherein X is a member selected from the group consisting of yttrium, scandium, lanthanum, neodymium, samarium, europium, gadolinium, terbium, dysprosium, holmium, erbium, thulium, ytterbium, lutetium, bismuth and thallium, Z is a member selected from the group consisting of barium, strontium, calcium, magnesium and mixtures thereof, a is not less than 1, b is from 0 to 3, c is from 0 to 3 and h is not greater than about 6. Additionally, the stable mixed metal oxide compositions containing nitrogen according to the present invention are preferably of the formula $X_aZ_bCu_cN_jO_k$ wherein X, Z, a, b and c are as previously defined and j is from about 0.001 to about 3 and k is from about 6 to about 13. Preferably, a is 1 or 2, and most preferably, a is 1; b is preferably 2; and c is preferably 3. Additionally, X preferably comprises yttrium. Preferably, Z comprises barium or a mixture of barium and at least one of strontium, calcium and magnesium.

In an additionally preferred embodiment of the present invention, Z comprises barium and the compositions are of the formula $XBa_2Cu_3N_jO_k$ wherein X, j and k are as previously defined. Preferably, j is from about 1 to about 3 and k is from about 10 to about 13.

The oxygen-deficient perovskite compositions from which the stable nitrogen containing compositions of the present invention are formed may be prepared by any method known in the art. For example, a superconducting oxygen containing material such as orthorhombic $YBa_2Cu_3O_7$, may be treated to remove oxygen, for example, such as by heating in a helium atmosphere. The resulting product is an oxygen deficient perovskite material, for example, $YBa_2Cu_3O_6$. In a preferred embodiment, the oxygen containing material which is used to prepare the oxygen-deficient perovskite is prepared by metal organic chemical vapor deposition methods such as are disclosed in the copending Sievers application Ser. No. 134,251 filed Dec. 17, 1987 which is incorporated herein in its entirety by reference.

In an additional embodiment of the invention, the mixed metal oxide compositions containing nitrogen may be further treated with fluorine in order to produce stable mixed metal oxide compositions containing both nitrogen and fluorine. Alternatively, the oxygen-deficient perovskite materials from which the present compositions are produced may be treated with fluorine prior to nitrogen dioxide treatment to similarly produce stable mixed metal oxide compositions containing both nitrogen and fluorine. Generally, the addition of small amounts of fluorine to superconducting compositions such as $YBa_2Cu_3O_7$ enhances the critical current density at the superconducting temperature by strengthening superconductive connections among the grains. The addition of small amounts of fluorine does not change the crystal structure of $YBa_2Cu_3O_7$ and the lattice parameter. The compositions according to the present invention resulting from fluorine treatment are preferably of the formula $X_aZ_bCu_cN_jO_kF_g$ wherein X, Z, a, b, c, j and k are as previously defined and g is not greater than about 2.

The compositions according to the present invention may be used to generate additional compositions of matter exhibiting superior electrical conductivity properties and/or catalytic properties. The materials according to the present invention may be used in magnets, generators, motors, magnetic shielding, magnetic levitation for transportation, contact-free bearings, as electrical connectors in computers, in superconducting quantum interference devices (SQUID's), in Josephson Junctions, and the like. Generally, superconducting properties of mixed metal oxides according to the present invention which are comparable to the $YBa_2Cu_3(NO_2)_dO_e$ compounds have been observed at temperatures above 77° K. Several exceptions are those compositions including cerium and elements that have stable quadrivalent forms. However, treatment of such materials with nitrogen dioxide provides compositions which are useful as catalysts, for example, for promoting redox reactions between nitrogen dioxide and reducing agents, regardless of whether superconductivity properties are exhibited.

The following examples demonstrate various specific embodiments of the compositions according to the present invention.

EXAMPLE 1

This example demonstrates the preparation of a semiconducting stable mixed metal oxide composition containing nitrogen according to the present invention. A sample of powdered (approximately 200 mesh) orthorhomic $YBa_2Cu_3O_7$ which exhibited the Meissner effect at 77° K. was heated to 800° C. under flowing helium to remove oxygen and form an oxygen-deficient tetragonal material of the formula $YBa_2Cu_3O_6$. This highly oxygen-deficient perovskite was cooled quickly without contact with oxygen and again tested for the Meissner effect. The Meissner effect was not observed at 77° K. Magnetization measurements showed that the material was no longer a superconductor after the described heat treatment and quenching treatment. The sample was then placed in a tube and heated to 200° C. Nitrogen dioxide (0.2 percent in helium) was passed over the sample for 40 hours (both $NO_2$ and small amounts of $N_2O_4$ are present in streams of gas flowing from a Teflon permeation tube containing $N_2O_4$ liquid). The sample was then cooled to 25° C. while continuing to flow $NO_2$ across it. The treated sample was cooled to 77° K. and exhibited the Meissner effect. In magnetization experiments conducted by the National Bureau of Standards, the onset of superconductivity in the material was measured to be at 91.5° K. and the midpoint of the transition from semiconductor to superconductor was measured to be 88° K. Infrared absorbance measurements on a sample of the material pressed into a KBr wafer were made and a strong absorbance at approximately 1385 $cm^{-1}$ was observed. The strong absorbance is characteristic of a nitrogen-oxygen stretching frequency such as is seen in coordination complexes in which $NO_2$ are bonded to various metal ions and exhibit absorbances typically from 1320 to 1435 $cm^{-1}$. Nitrate salts also absorb in this region which indicates that the nitrogen may exist as a nitrate or as a nitro or nitrito complex. The nitrogen was strongly bonded in the material and was not removed by heating at temperatures below 300° C. in a flowing helium stream. Only by heating at much higher temperatures (400° to 800° C.) was $NO_2$ rapidly caused to evolve from the sample.

The composition was measured by a combination of techniques including mass spectrometry, thermogravimetric analysis and elemental analysis. The $O_2$ and $NO_2$ emitted upon heating to 800° C. were measured by mass spectrometry using a Hewlett-Packard Model 5980A mass spectrometer. Barium was measured gravimetrically as $BaSO_4$ by dissolving a sample in 20 percent HCl and adding sodium sulfate, followed by filtration and ignition. Copper was measured by atomic absorption spectrophotometry.

Additional samples were prepared using the above nitrogen dioxide treatment with temperatures varying over the range of from about 150° C. to about 400° C. with varying time periods of treatment. The resulting compositions ranged between $YBa_2Cu_3NO_9$ and $YBa_2Cu_3N_3O_{13}$.

EXAMPLE 2

As set forth above, the compositions according to the present invention are advantageous in that they may be prepared under relatively mild conditions. This example demonstrates the preparation of a material according to the present invention using a nitrogen dioxide treatment and the treatment of an oxygen-deficient perovskite with oxygen under similar conditions. First, $NO_2$ in helium (0.2 percent) was passed over an oxygen-deficient perovskite material comprising $YBa_2Cu_3O_6$ at 170° C. for 40 hours. A material which was superconducting at 88° K. was produced. Treatment of the same oxygen-deficient material with pure oxygen under the same conditions did not yield a material exhibiting the Meissner effect at 77° K. This demonstrates that $NO_2$ is a more active oxygen source than $O_2$ and fills oxygen vacancies while inserting $NO_2$ into the structure of the oxygen-deficient perovskite.

The compositions according to the present invention also encompass the rare earth-free superconducting materials such as $Bi_2CaSr_2Cu_2O_8$, $Tl_2CaBa_2Cu_2O_8$ and $TlCa_2Ba_2Cu_3O_{10}$ which are subjected to nitrogen dioxide treatment to produce the corresponding nitrogen containing compositions. The resulting nitrogen containing materials should also exhibit higher critical temperatures, removal of impurities and/or protection against water and carbon dioxide attack.

The preceding examples were set forth to illustrate specific embodiments of the invention and are not intended to limit the scope of the compositions and methods of the present invention. Additional embodiments and advantages within the scope of the claimed invention will be apparent to one of ordinary skill in the art.

What is claimed is:

1. A composition of matter of the formula $$XZ_2Cu_3N_jO_k$$

wherein X is selected from the group consisting of yttrium, thallium and bismuth, Z is selected from the group consisting of barium and mixtures of barium with one or more elements selected from the group consisting of strontium, calcium and magnesium, j is from about 1 to about 3 and k is from about 9 to about 13.

2. A composition as defined in claim 1, wherein Z comprises barium.

3. A composition as defined by claim 1, wherein X comprises yttrium.

4. A composition as defined by claim 1, wherein Z comprises a mixture of barium and at least one of strontium, calcium and magnesium.

5. A composition as defined in claim 1, wherein k is from about 10 to about 13.

6. A composition of matter of the formula $$XZ_2Cu_3N_jO_kF_g$$

wherein X is selected from the group consisting of yttrium, thallium and bismuth, Z is selected from the group consisting of barium and mixtures of barium with one or more elements selected from the group consisting of strontium, calcium and magnesium, j is from about 1 to about 3, k is from about 9 to about 13, and g is not greater than about 2.

7. A composition as defined by claim 6, wherein Z comprises barium.

8. A composition as defined by claim 6, wherein X comprises yttrium.

9. A composition as defined by claim 6, wherein Z comprises a mixture of barium and at least one of strontium, calcium and magnesium.

10. A composition as defined by claim 6, wherein k is from about 10 to about 13.

* * * * *